United States Patent
Park et al.

(10) Patent No.: US 8,278,168 B2
(45) Date of Patent: Oct. 2, 2012

(54) METHODS OF FORMING A SEMICONDUCTOR DEVICE

(75) Inventors: Hongbae Park, Seoul (KR); Hagju Cho, Hwaseong-si (KR); Sunghun Hong, Yongin-si (KR); Sangjin Hyun, Suwon-si (KR); Hoonjoo Na, Hwaseong-si (KR); Hyung-seok Hong, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/237,051

(22) Filed: Sep. 20, 2011

(65) Prior Publication Data

US 2012/0009746 A1  Jan. 12, 2012

Related U.S. Application Data

(62) Division of application No. 12/585,313, filed on Sep. 11, 2009, now Pat. No. 8,044,469.

(30) Foreign Application Priority Data

Sep. 19, 2008  (KR) .................. 10-2008-0092245
May 12, 2009  (KR) .................. 10-2009-0041271

(51) Int. Cl.
   *H01L 21/8242* (2006.01)

(52) U.S. Cl. ........ 438/240; 438/200; 438/216; 438/287; 438/288; 257/350; 257/369; 257/406; 257/410; 257/412; 257/E21.626

(58) Field of Classification Search ................. None
See application file for complete search history.

(56) References Cited

U.S. PATENT DOCUMENTS

| | | | |
|---|---|---|---|
| 6,602,805 B2 * | 8/2003 | Chang | ................... 438/785 |
| 6,893,927 B1 | 5/2005 | Shah et al. | |
| 6,897,095 B1 | 5/2005 | Adetutu et al. | |
| 7,169,681 B2 | 1/2007 | Cho et al. | |
| 2008/0050870 A1 | 2/2008 | Yamamoto | |

FOREIGN PATENT DOCUMENTS

| | | |
|---|---|---|
| JP | 2007-537595 A | 12/2007 |
| JP | 2008-053283 A | 3/2008 |
| KR | 10-2005-0036005 A | 4/2005 |
| KR | 10-2007-0017555 A | 2/2007 |

* cited by examiner

*Primary Examiner* — Kyoung Lee
(74) *Attorney, Agent, or Firm* — Lee & Morse, P.C.

(57) ABSTRACT

A semiconductor device and associated methods, the semiconductor device including a semiconductor substrate with a first well region, a first gate electrode disposed on the first well region, and a first N-type capping pattern, a first P-type capping pattern, and a first gate dielectric pattern disposed between the first well region and the first gate electrode.

9 Claims, 15 Drawing Sheets

METHODS OF FORMING A SEMICONDUCTOR DEVICE

CROSS REFERENCE TO RELATED APPLICATION

This is a divisional application based on application Ser. No. 12/585,313, filed Sep. 11, 2009 now U.S. Pat. No. 8,044,469, the entire contents of which is hereby incorporated by reference.

BACKGROUND

1. Field

Embodiments relate to a semiconductor device and associated methods.

2. Description of the Related Art

A gate structure of metal oxide semiconductor (MOS) transistors having a minimum critical dimension of less than about 45 nm is being actively researched. The gate structure may include a stacked structure of a high-k dielectric/metal gate electrode or a stacked structure of a high-k dielectric/polysilicon gate electrode. The stacked structure of the high-k dielectric/metal gate electrode may have a threshold voltage (Vth) lower than that of the stacked structure of the high-k dielectric/polysilicon gate electrode. However, to achieve a high performance operation of transistors, the stacked structure of the high-k dielectric/metal gate electrode should have a lower threshold voltage (Vth).

SUMMARY

Embodiments are directed to a semiconductor device and associated methods, which substantially overcome one or more of the drawbacks, limitations, and/or disadvantages of the related art.

It is a feature of an embodiment to provide a semiconductor device, which can use a plurality of capping patterns to adjust a threshold voltage.

At least one of the above and other features and advantages may be realized by providing a semiconductor device including a semiconductor substrate with a first well region, a first gate electrode disposed on the first well region, and a first N-type capping pattern, a first P-type capping pattern, and a first gate dielectric pattern disposed between the first well region and the first gate electrode.

The first N-type capping pattern may include at least one of LaO, GdO, DyO, SrO, BaO, and ErO.

The first P-type capping pattern may include at least one of an aluminum oxide layer and an aluminum metal oxide layer.

The first gate dielectric pattern may include at least one of a silicon oxide layer, a silicon oxide nitride layer, a hafnium oxide layer, a hafnium silicon oxide layer, a zirconium oxide layer, a zirconium silicon oxide layer, a hafnium oxide nitride layer, a hafnium silicon oxide nitride layer, a zirconium oxide nitride layer, a zirconium silicon oxide nitride layer, and a tantalum oxide layer.

The first gate electrode may include at least one of TaC, TaN, TaCN, and TiN.

The first gate dielectric pattern may include a first upper gate dielectric pattern and a first lower gate dielectric pattern.

The semiconductor device may further include a second well region disposed in the semiconductor substrate, a second gate electrode disposed on the second well region, and a second P-type capping pattern and a second gate dielectric pattern disposed between the second well region and the second gate electrode, wherein the first gate dielectric pattern includes the same material as the second gate dielectric pattern, and the first gate electrode includes the same material as the second gate electrode.

The first well region may include a P-type impurity region, and the second well region may include an N-type impurity region.

The semiconductor substrate may include a semiconductor fin protruding therefrom, the first well region may be disposed in the semiconductor fin, and the first gate electrode may cross the first well region.

At least one of the above and other features and advantages may also be realized by providing a method of forming a semiconductor device including forming a trench in a semiconductor substrate, forming a device isolation layer in the trench to define at least one active region, forming a first well region in the semiconductor substrate, forming, on the semiconductor substrate including the device isolation layer, a first N-type capping layer, forming a first gate dielectric on the first N-type capping layer, forming a first P-type capping layer on the first gate dielectric, forming a first gate conductive layer on the first P-type capping layer, and patterning the layers to form a first gate electrode, a first P-type capping pattern, a first gate dielectric pattern, and a first N-type capping pattern.

At least one of the above and other features and advantages may also be realized by providing a method of forming a semiconductor device including forming a trench in a semiconductor substrate, forming a device isolation layer in the trench to define at least one active region, forming a first well region and a second well region in the semiconductor substrate, and forming a first gate structure on the first well region and a second gate structure on the second well region, such that the first gate structure includes a first N-type capping pattern, a first gate dielectric pattern, a first P-type capping pattern, and a first gate electrode, such that the second gate structure includes a second gate dielectric pattern, a second P-type capping pattern, and a second gate electrode, and such that the first P-type capping pattern includes the same material as the second P-type capping pattern, and the first gate electrode includes the same material as the second gate electrode.

Forming the first gate structure on the first well region and the second gate structure on the second well region may include forming an N-type capping layer on the first well region, forming a gate dielectric layer on the first well region and the second well region, forming a P-type capping layer on an entire surface of the gate dielectric layer, forming a gate conductive layer on the P-type capping layer, and patterning a stack of the layers on the first well region and the second well region to form the first gate structure and the second gate structure.

The forming of the first gate structure on the first well region and the second gate structure on the second well region may include forming a lower gate dielectric layer on the first well region and the second well region, forming an N-type capping layer on the lower gate dielectric layer of the first well region, forming an upper gate dielectric layer on the first well region and the second well region, forming a P-type capping layer on an entire surface of the upper gate dielectric layer, forming a gate conductive layer on the P-type capping layer, and patterning a stack of the layers on the first well region and the second well region to form the first gate structure and the second gate structure.

The forming of the first gate structure on the first well region and the second gate structure on the second well region may include forming an N-type capping layer on the first well region, forming a lower gate dielectric layer on the second well region, nitriding the N-type capping layer and the lower gate dielectric layer, forming an upper gate dielectric layer on entire surfaces of the N-type capping layer and the lower gate dielectric layer, forming a P-type capping layer on an entire surfaces of the upper gate dielectric, forming a gate conductive layer on the P-type capping layer, and patterning a stack of the layers on the first well region and the second well region to form the first gate structure and the second gate structure.

The forming of the first gate structure on the first well region and the second gate structure on the second well region may include forming an N-type capping layer on the first well region, forming a gate dielectric layer on the N-type capping layer and the second well region, forming a P-type capping layer on entire surfaces of the N-type capping layer and the gate dielectric layer, forming a gate conductive layer on the P-type capping layer, and patterning a stack of the layers on the first well region and the second well region to form the first gate structure and the second gate structure.

The first N-type capping pattern may include at least one of LaO, GdO, DyO, SrO, BaO, and ErO.

The first P-type capping pattern may include at least one of an aluminum oxide layer and an aluminum metal oxide layer.

The first gate dielectric pattern and the second gate dielectric pattern may each independently include at least one of a silicon oxide layer, a silicon oxide nitride layer, a hafnium oxide layer, a hafnium silicon oxide layer, a zirconium oxide layer, a zirconium silicon oxide layer, a hafnium oxide nitride layer, a hafnium silicon oxide nitride layer, a zirconium oxide nitride layer, a zirconium silicon oxide nitride layer, and a tantalum oxide layer.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
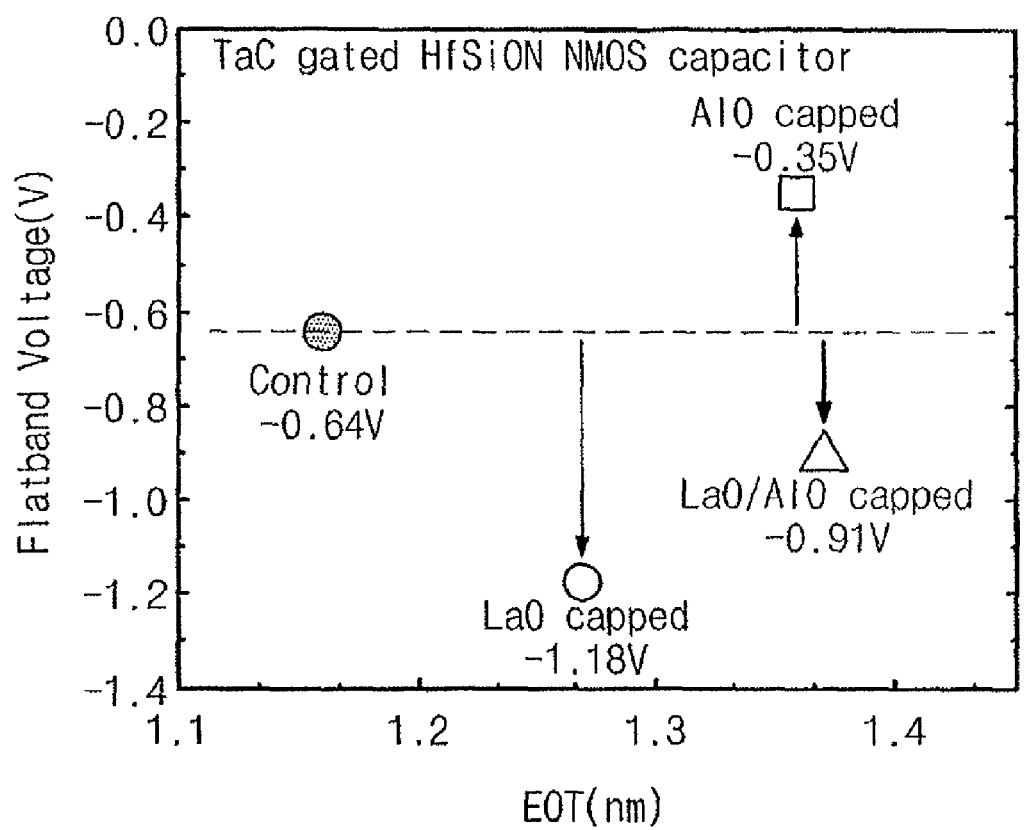
FIG. 1 illustrates a graph of a flat band voltage depending on a structure of a semiconductor device (an NMOS capacitor) according to an embodiment.

Korean Patent Application Nos. 10-2008-0092245, filed on Sep. 19, 2008, and 10-2009-0041271, filed on May 12, 2009, in the Korean Intellectual Property Office, are incorporated by reference herein in their entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a graph of a flat band voltage depending on a structure of a semiconductor device (an NMOS capacitor) according to an embodiment. Referring to FIG. 1, in the NMOS capacitor, a gate structure may be disposed on a semiconductor substrate. The gate structure may include a gate dielectric and a gate electrode. The gate electrode may include, e.g., tantalum carbide (TaC), and the gate dielectric may include, e.g., HfSiON, HfSiON/LaO, HfSiON/AlO, and/or HfSiON/LaO/AlO. A flat band voltage and an effective oxide thickness (EOT) of the capacitor were measured according to the structures of the gate electrode. The flat band voltage of the HfSiON structure (control structure) was about −0.64 V and the flat band voltage of the HfSiON/LaO structure (LaO capped structure) was about −1.184 V. Also, the flat band voltage of the HfSiON/AlO structure (AlO capped structure) was about −0.35 V and the flat band voltage of the HfSiON/LaO/AlO structure (LaO/AlO capped structure) was about −0.91 V. In these cases, the HfSiON layers had the same thickness, and the LaO layers and the AlO layers had physical thicknesses of about 1 nm, respectively. However, the EOT of the HfSiON/LaO/AlO structure hardly increased when compared to that of the HfSiON/AlO structure. Thus, if LaO-based materials and AlO-based materials are appropriately combined, a desired threshold voltage may be obtained. The LaO-based materials may include, e.g., LaO, GdO, DyO, SrO, BaO, and/or ErO. The LaO-based materials may include, e.g., N-type capping materials. Also, the AlO-based materials may include, e.g., an aluminum oxide and/or an aluminum metal oxide. The AlO-base materials may include, e.g., P-type capping materials.

The threshold voltage (Vth) of a semiconductor device may depend on a thickness of a gate dielectric and an ion implantation concentration of a semiconductor substrate. According to an embodiment, the threshold voltage of a semiconductor device may be changed without an EOT change when the device includes a combination of a gate dielectric layer, an N-type capping layer, and a P-type capping layer. The N-type capping layer may decrease the flat band voltage, and the P-type capping layer may increase the flat band voltage. The N-type capping layer may include, e.g., LaO, GdO, DyO, SrO, BaO, and/or ErO. The P-type capping layer may include, e.g., an aluminum oxide layer and/or an aluminum metal oxide layer.

Figure 2A:
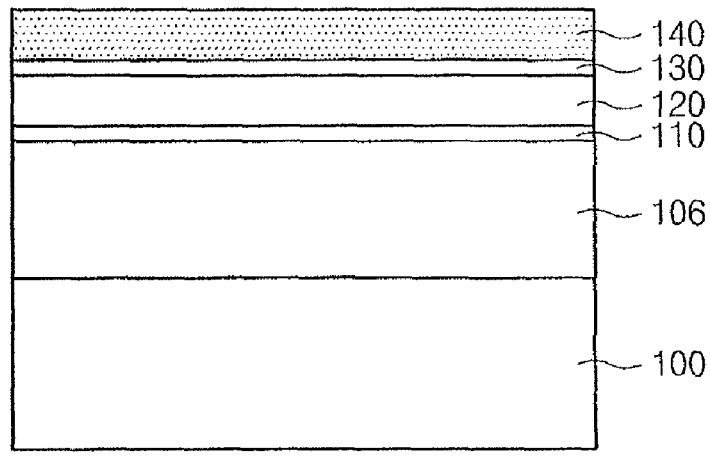
FIGS. 2A and 2B illustrate cross-sectional views of a semiconductor device according to embodiments.
Figure 2B:
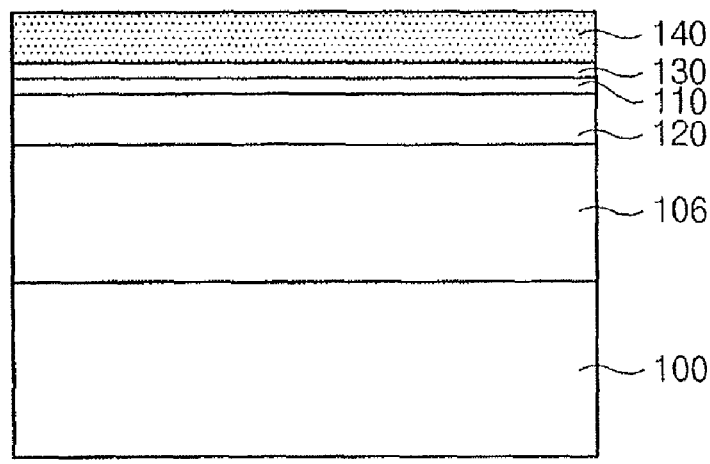

FIGS. 2A and 2B illustrate cross-sectional views of semiconductor devices according to embodiments. Referring to FIGS. 2A and 2B, the semiconductor device may include a semiconductor substrate 100, a first well region 106 disposed in the semiconductor substrate 100, a first gate electrode 140 disposed on the first well region 106, and a first N-type capping pattern 110, a first P-type capping pattern 130, and a first gate dielectric pattern 120. The first N-type capping pattern 110, the first P-type capping pattern 130, and the first gate dielectric pattern 120 may be disposed between the first well region 106 and the first gate electrode 140. The first N-type capping pattern 110 may decrease the flat band voltage and the first P-type capping pattern 130 may increase the flat band voltage. The semiconductor device may be used as, e.g., a capacitor or a transistor. The first N-type capping pattern 110, the first gate dielectric pattern 120, and the first P-type capping pattern 130 may be sequentially stacked.

The semiconductor substrate 100 may include, e.g., a silicon substrate or a SOI substrate. The first well region 106 may be, e.g., a P-well or an N-well. The first gate electrode 140 may include, e.g., TaC, TaN, TaCN, and/or TiN. The first gate electrode 140 may have a multi-layer structure. The first gate electrode 140 may include, e.g., a metal layer, a metal silicide layer, a metal oxide layer, a metal nitride layer, and/or a doped polysilicon layer.

The first N-type capping pattern 110 may include LaO, GdO, DyO, SrO, BaO, and/or ErO. The first N-type capping pattern 110 may decrease a flat band voltage of the semiconductor device. The first N-type capping pattern 110 may have a thickness of about 0.1 nm to about 10 nm.

The first P-type capping pattern 130 may include, e.g., an aluminum oxide layer and/or an aluminum metal oxide layer. The first P-type capping pattern 130 may increase the flat band voltage. The first P-type capping pattern 130 may have a thickness of about 0.1 nm to about 10 nm. The first N-type capping pattern 110 and the first P-type capping pattern 130 may each have thicknesses less than a thickness of the gate dielectric pattern 120.

The first gate dielectric pattern 120 may include, e.g., a silicon oxide layer, a silicon oxide nitride layer, a hafnium oxide layer, a hafnium silicon oxide layer, a zirconium oxide layer, a zirconium silicon oxide layer, a hafnium oxide nitride layer, a hafnium silicon oxide nitride layer, a zirconium oxide nitride layer, a zirconium silicon oxide nitride layer, and/or a tantalum oxide layer. The first gate dielectric pattern 120 may include, e.g., a high-k dielectric material having a dielectric constant greater than that of a silicon oxide layer.

In an implementation, the first N-type capping pattern 110 and the first P-type capping pattern 130 may be alternately stacked. In another implementation, the first gate dielectric pattern 120, the first N-type capping pattern 110, and the first P-type capping pattern 130 may be sequentially stacked. In yet another implementation, a stack sequence of the first gate dielectric pattern 120, the first N-type capping pattern 110, and the first P-type capping pattern 130 may be changed. In still another implementation, the first gate dielectric pattern 120 may include a first lower gate dielectric pattern and a first upper gate dielectric pattern (not shown). The first lower gate dielectric pattern and the first upper gate dielectric pattern may include materials different from each other. Also, the first lower gate dielectric pattern and the first upper gate dielectric pattern may not be sequentially stacked.

Figure 3:
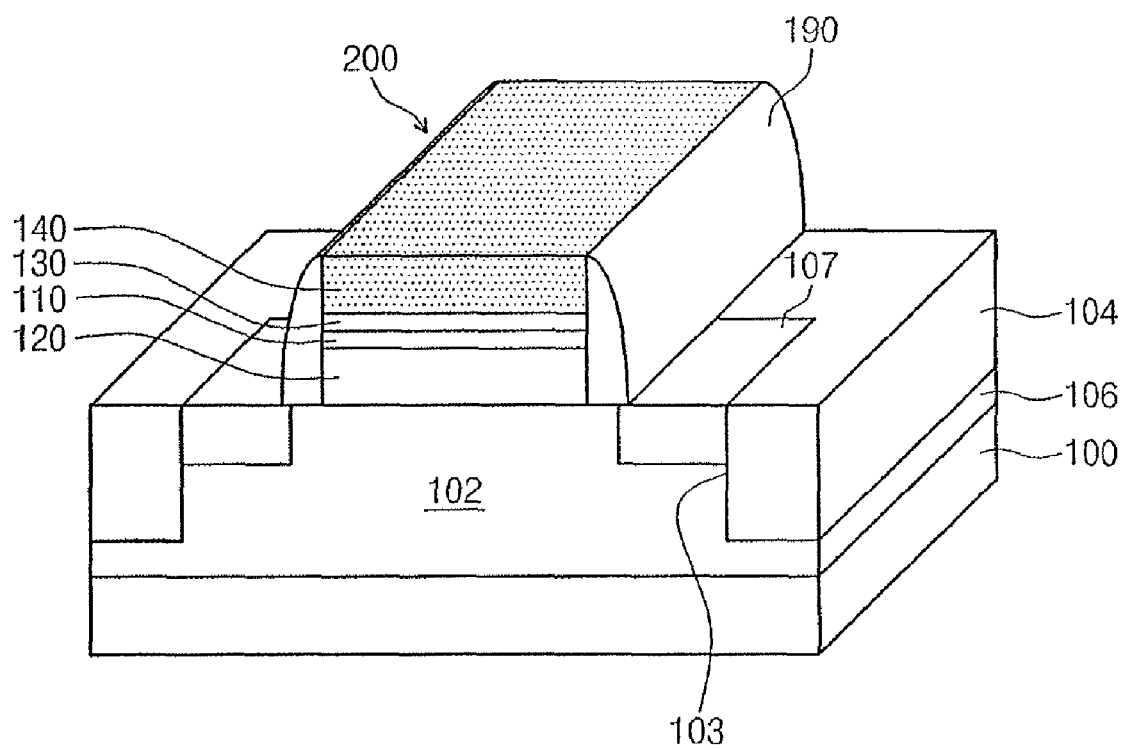
FIG. 3 illustrates a perspective view of a semiconductor device according to another embodiment.

FIG. 3 illustrates a perspective view of a semiconductor device according to another embodiment. Referring to FIG. 3, the semiconductor device may include a semiconductor substrate 100, a first well region 106 disposed in the semiconductor substrate 100, a first gate electrode 140 disposed on the first well region 106, and a first N-type capping pattern 110, a first P-type capping pattern 130, and a first gate dielectric pattern 120. The first N-type capping pattern 110, the first P-type capping pattern 130, and the first gate dielectric pattern 120 may be disposed between the first well region 106 and the first gate electrode 140. The first N-type capping pattern 110 may decrease the flat band voltage, and the first P-type capping pattern 130 may increase the flat band voltage. The semiconductor device may be used as, e.g., a transistor. The first gate dielectric pattern 120, the first N-type capping pattern 110, and the first P-type capping pattern 130 may be sequentially stacked.

A trench 103 may be formed in the semiconductor substrate to define an active region 102. The trench 103 may be filled with a device isolation layer 104. The device isolation layer 104 may be formed using, e.g., a shallow trench isolation process. A height of a top surface of the active region 102 may be substantially equal to a height of a top surface of the device isolation layer 104.

An ion implantation process may be performed on the semiconductor substrate including the device isolation layer 104 to form the first well region 106. A height of a bottom surface of the first well region 106 may be lower than a height of a bottom surface of the device isolation layer 104. The first well region 106 may be, e.g., a P-well or an N-well. A gate structure 200 may be disposed on the first well region 106. The gate structure 200 may include the first gate dielectric pattern 120, the first N-type capping pattern 110, the first P-type capping pattern 130, and the first gate electrode 140, which may be sequentially stacked. A spacer dielectric 190 may be disposed on a sidewall of the gate structure 200. A source/drain 107 may be disposed in the active region 102 at sides of the gate structure 200.

Figure 4:
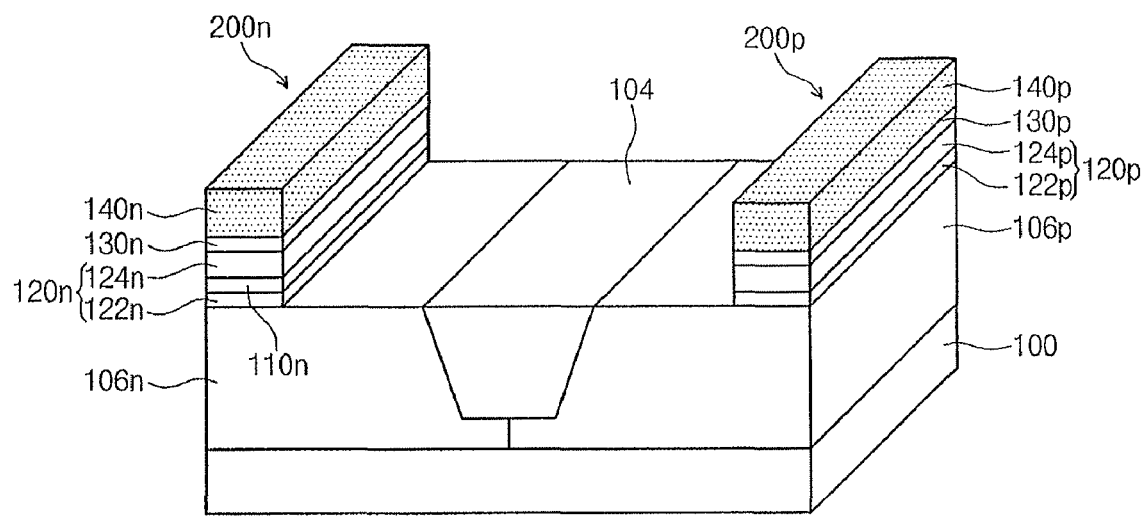
FIGS. 4 to 6 illustrate perspective views of semiconductor devices according to embodiments.
Figure 5:
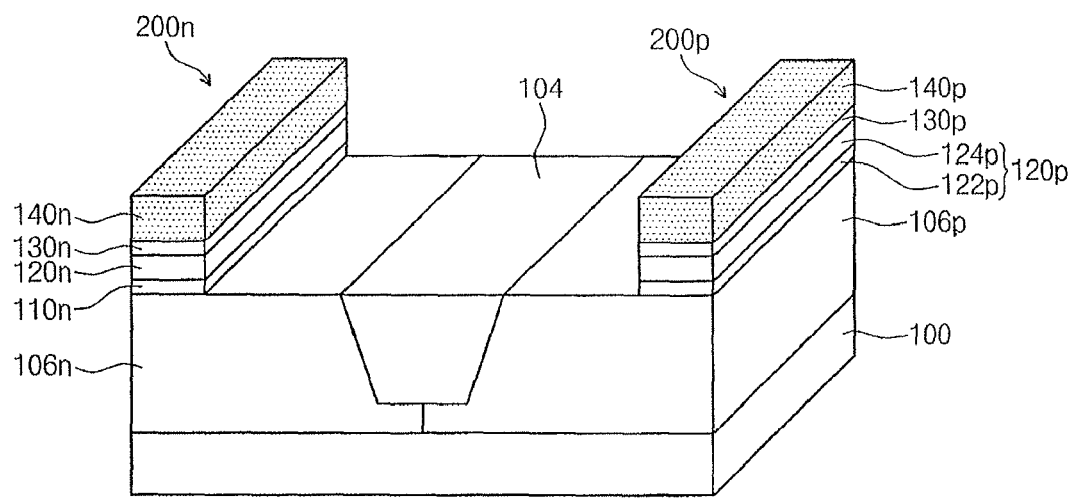
Figure 6:
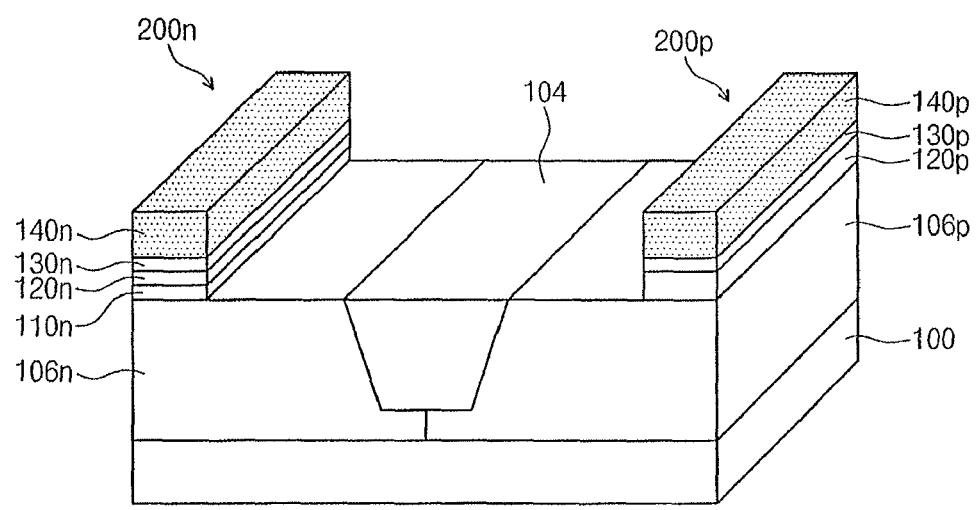

FIGS. 4 to 6 illustrate perspective views of semiconductor devices according to embodiments. Referring to FIG. 4, the semiconductor device may include a semiconductor substrate 100, a first well region 106n disposed in the semiconductor substrate 100, and a first gate structure 200n disposed on the first well region 106n. The device may also include a second well region 106p disposed in the semiconductor substrate 100 and a second gate structure 200p disposed on the second well region 106p. The first gate structure 200n may include a first gate electrode 140n, a first N-type capping pattern 110n, a first P-type capping pattern 130n, and a first gate dielectric pattern 120n. The first N-type capping pattern 110n, the first P-type capping pattern 130n, and the first gate dielectric pattern 120n may be disposed between the first well region 106n and the first gate electrode 140n. The first gate dielectric pattern 120n may include a first lower gate dielectric pattern 122n and a first upper gate dielectric pattern 124n. The first N-type capping pattern 110n may decrease the flat band voltage and the first P-type capping pattern 130n may increase the flat band voltage.

The second gate structure 200p may also include a second gate electrode 140p disposed on the second well region 106p, a second P-type capping pattern 130p, and a second gate dielectric pattern 120p. The second P-type capping pattern 130p and the second gate dielectric pattern 120p may be disposed between the second well region 106p and the second gate electrode 140p. The first gate electrode 140n and the second gate electrode 140p may include the same material as each other. The second gate dielectric pattern 120p may include a second lower gate dielectric pattern 122p and a second upper gate dielectric pattern 124p.

A device isolation layer 104 may be disposed on the semiconductor substrate 100. The isolation layer 104 may be formed using, e.g., a shallow trench isolation process. Active regions may be defined by the device isolation layer 104. The active regions may be electrically isolated from each other by the device isolation layer 104. The first gate structure 200n and the second gate structure 200p may be disposed on the semiconductor substrate 100. The first well region 106n may be doped with P-type impurities. The second well region 106p may be doped with N-type impurities. An NMOS may be disposed on the first well region 106n, and a PMOS may be disposed on the second well region 106p.

The NMOS may include the first well region 106n and the first gate structure 200n. The PMOS may include the second well region 106p and the second gate structure 200p.

The first N-type capping pattern 110n may include, e.g., LaO, GdO, DyO, SrO, BaO, and/or ErO. The first P-type capping pattern 130n and the second P-type capping pattern 130p may each independently include, e.g., an aluminum oxide layer and/or an aluminum metal oxide layer. The first P-type capping pattern 130n and the second P-type capping pattern 130p may include the same material as each other.

The first lower gate dielectric pattern 122n, the first upper gate dielectric pattern 124n, the second lower gate dielectric pattern 122p, and the second upper gate dielectric pattern 124p may each independently include, e.g., a silicon oxide layer, a silicon oxide nitride layer, a hafnium oxide layer, a hafnium silicon oxide layer, a zirconium oxide layer, a zirconium silicon oxide layer, a hafnium oxide nitride layer, a hafnium silicon oxide nitride layer, a zirconium oxide nitride layer, a zirconium silicon oxide nitride layer, and/or a tantalum oxide layer. The first lower gate dielectric pattern 122n and the second lower gate dielectric pattern 122p may include the same material as each other. The first upper gate dielectric pattern 124n and the second upper gate dielectric pattern 124p may include the same material as each other.

The first gate electrode 140n and the second gate electrode 140p may each independently include, e.g., TaC, TaN, TaCN, and/or TiN. The first and second gate electrodes 140n and 140p may each have multi-layer structures. The first and second gate electrodes 140n and 140p may each independently include, e.g., a metal layer, a metal silicide layer, a metal oxide layer, a metal nitride layer, and/or a doped polysilicon layer. The first gate electrode 140n and the second gate electrode 140p may include the same material as each other.

In an implementation, the first lower gate dielectric pattern 122n and the second lower gate dielectric pattern 122p may be omitted.

A gate structure of a MOS transistor having a minimum critical dimension of less than about 45 nm may include a stacked structure of a high-k dielectric/metal gate electrode. The stacked structure of the high-k dielectric/metal gate electrode may have a threshold voltage Vth lower than that of a stacked structure of a high-k dielectric/polysilicon gate electrode. However, to make practical use of this structure, the stacked structure of the high-k dielectric/metal gate electrode should have a lower threshold voltage.

In a complementary MOS (CMOS) using a dual metal gate, it may be difficult to secure an optimum metal gate material in an NMOS and a PMOS. In addition, a high-k dielectric may be damaged during a dual metal gate fabrication process. In a CMOS using a single metal gate and a single capping layer, the capping layer may be applicable to only a PMOS. Thus, an optimum metal gate material should be secured, and a high-k dielectric may be damaged during a PMOS fabrication process.

In a CMOS using a single metal gate and two capping layers, the two capping layers should be deposited on and removed from an NMOS and a PMOS, respectively. In addition, a high-k dielectric may be damaged during NMOS and PMOS fabrication processes. Thus, a method of forming the semiconductor device according to an embodiment may use an N-type capping layer having a superior threshold voltage reduction effect than the threshold voltage reduction effect of a P-type capping layer.

Referring to FIG. 5, the semiconductor device may include a semiconductor substrate 100, a first well region 106n disposed in the semiconductor substrate 100, and a first gate structure 200n disposed on the first well region 106n. The device may also include a second well region 106p disposed on the semiconductor substrate 100 and a second gate structure 200p disposed on the second well region 106p.

The first gate structure 200n may include a first N-type capping pattern 110n, a first gate dielectric pattern 120n, a first P-type capping pattern 130n, and a first gate electrode 140n, which may be sequentially stacked on the first well region 106n. The second gate structure 200p may include a second lower gate dielectric pattern 122p, a second upper gate dielectric pattern 124p, a second P-type capping pattern 130p, and a second gate electrode 140p, which may be sequentially stacked on the second well region 106p. A second gate dielectric pattern 120p may include the second lower gate dielectric pattern 122p and the second upper gate dielectric pattern 124p.

The first gate electrode 140n and the second gate electrode 140p may include the same material as each other. The first gate dielectric pattern 120n and the second upper gate dielectric pattern 124p may include the same material as each other. The first P-type capping pattern 130n and the second P-type capping pattern 130p may include the same material as each other.

The first N-type capping pattern 110n may include, e.g., LaO, GdO, DyO, SrO, BaO, and/or ErO. The first P-type capping pattern 130n and the second P-type capping pattern 130p may each independently include, e.g., an aluminum oxide layer and/or an aluminum metal oxide layer.

The first gate dielectric pattern 120n, the second lower gate dielectric pattern 122p, and the second upper gate dielectric pattern 124p may each independently include, e.g., a silicon oxide layer, a silicon oxide nitride layer, a hafnium oxide layer, a hafnium silicon oxide layer, a zirconium oxide layer, a zirconium silicon oxide layer, a hafnium oxide nitride layer, a hafnium silicon oxide nitride layer, a zirconium oxide nitride layer, a zirconium silicon oxide nitride layer, and/or a tantalum oxide layer.

Referring to FIG. 6, the semiconductor device may include a semiconductor substrate 100, a first well region 106n disposed in the semiconductor substrate 100, and a first gate structure 200n disposed on the first well region 106n. The device may also include a second well region 106p disposed in the semiconductor substrate 100 and a second gate structure 200p disposed on the second well region 106p.

The first gate structure 200n may include a first N-type capping pattern 110n, a first gate dielectric pattern 120n, a first P-type capping pattern 130n, and a first gate electrode 140n, which may be sequentially stacked on the first well region 106n. The second gate structure 200p may include a second gate dielectric pattern 120p, a second P-type capping pattern 130p, and a second gate electrode 140p, which may be sequentially stacked on the second well region 106p.

The first gate electrode 140n and the second gate electrode 140p may include the same material as each other. The first gate dielectric pattern 120n and the second gate dielectric pattern 120p may include the same material as each other. The first gate dielectric pattern 120n may have a thickness different from a thickness of the second gate dielectric pattern 120p. The first gate dielectric pattern 120n may have a smaller thickness than the thickness of the second gate dielectric pattern 120p. The first P-type capping pattern 130n and the second P-type capping pattern 130p may include the same material as each other.

Figure 7A:
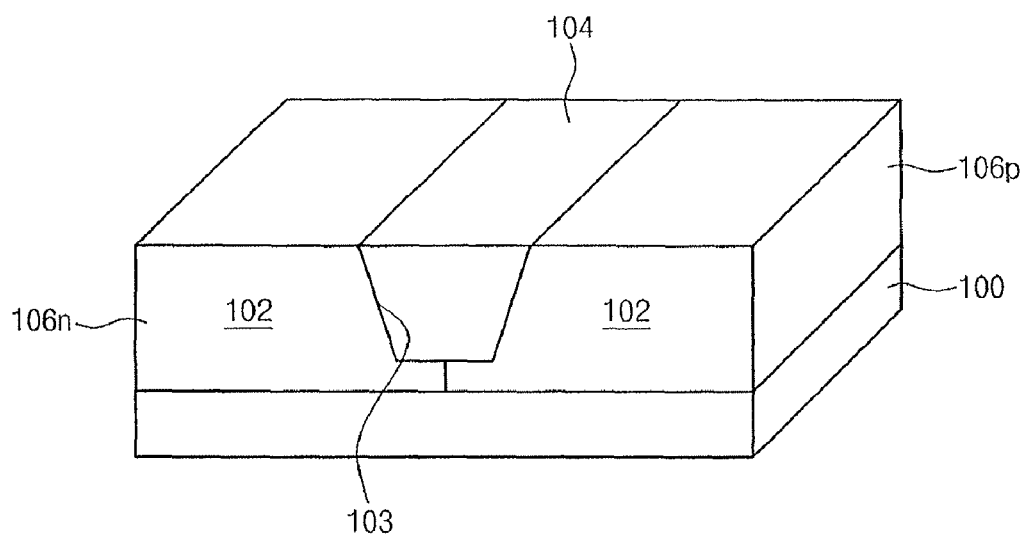
FIGS. 7A to 7E illustrate perspective views of a process of forming a semiconductor device according to an embodiment.

FIGS. 7A to 7E illustrate perspective views of a process of forming a semiconductor device according to an embodiment. Referring to FIG. 7A, a trench 103 may be formed in a semiconductor substrate 100 to define an active region 102. The trench 103 may be filled with a device isolation layer 104. A height of a top surface of the device isolation layer 104 may be substantially equal to a height of a top surface of the active region 102. The device isolation layer 104 may be formed using, e.g., a shallow trench isolation process. After the device isolation layer 104 is formed, an ion implantation process may be performed to form the first well region 106n and the second well region 106p in the semiconductor substrate 100. The first well region 106n may be a P-well and the second well region 106p may be an N-well. In an implementation, the first well region 106n and the second well region 106p may be formed before the device isolation layer 104 is formed.

Figure 7B:
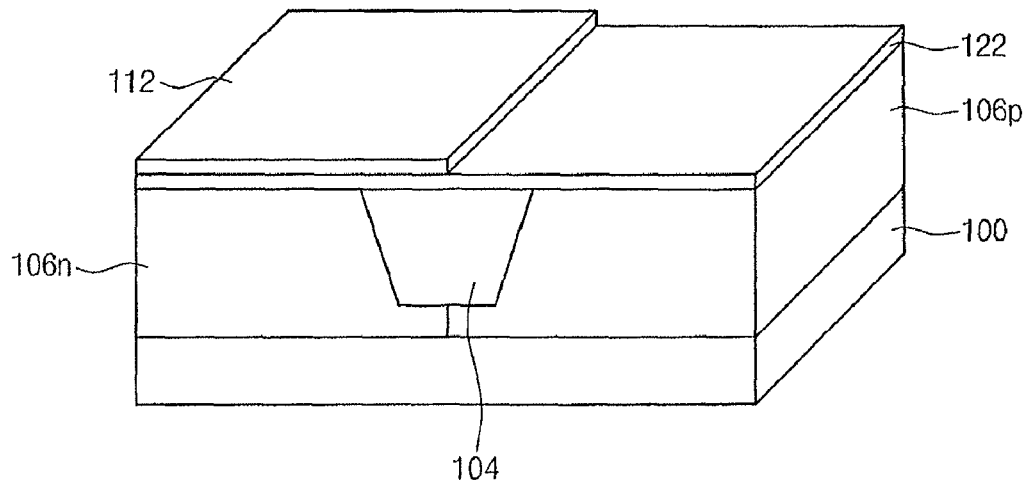

Referring to FIG. 7B, a lower gate dielectric layer 122 may be formed on an entire surface of the semiconductor substrate 100. The lower gate dielectric layer 122 may include, e.g., a silicon oxide layer, a silicon oxide nitride layer, and/or a high-k dielectric layer. The lower gate dielectric layer 122 may be formed using, e.g., a chemical vapor deposition process, a thermal oxidation process, or an atomic layer deposition process. In the thermal oxidation process, the lower gate dielectric layer 122 may not be formed on the device isolation layer 104.

An N-type capping layer 112 may be formed on the lower gate dielectric layer 122. A portion of the N-type capping layer formed on the second well region 106p may then be selectively etched. The selective etch process may include, e.g., a wet etch process or a dry etch process. The N-type capping layer 112 may include, e.g., LaO, GdO, DyO, SrO, BaO, and/or ErO. The N-type capping layer 112 may decrease a flat band voltage of the semiconductor device.

In an alternate implementation, the N-type capping layer may be formed on only the first well region 106n without forming the lower gate dielectric layer 122.

Figure 7C:
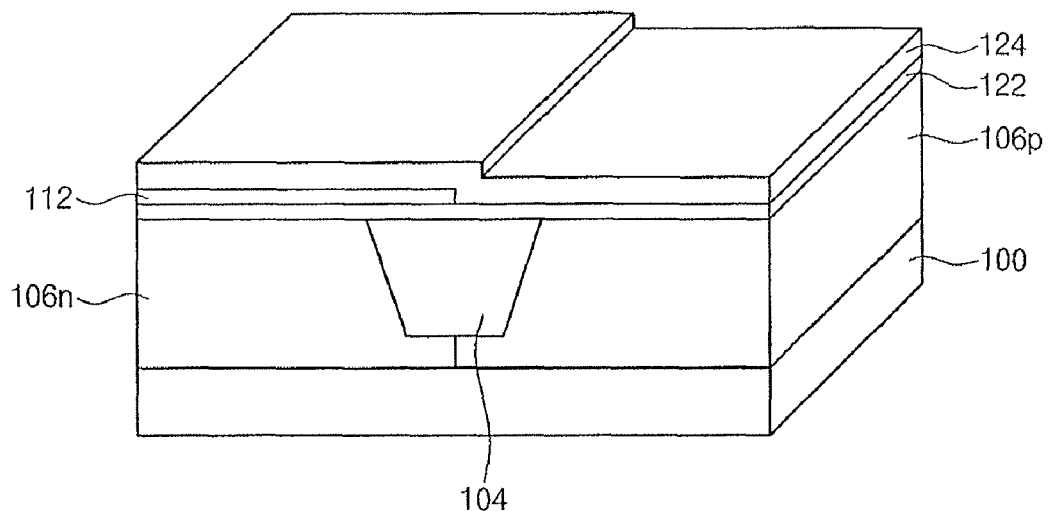

Referring to FIG. 7C, an upper gate dielectric layer 124 may be formed on an entire surface of the semiconductor substrate 100. The upper gate dielectric layer 124 may be formed using, e.g., a chemical vapor deposition process, a thermal oxidation process, or an atomic layer deposition process. The upper gate dielectric layer 124 may include, e.g., a silicon oxide layer, a silicon oxide nitride layer, a hafnium oxide layer, a hafnium silicon oxide layer, a zirconium oxide layer, a zirconium silicon oxide layer, a hafnium oxide nitride layer, a hafnium silicon oxide nitride layer, a zirconium oxide nitride layer, a zirconium silicon oxide nitride layer, and/or a tantalum oxide layer.

Figure 7D:
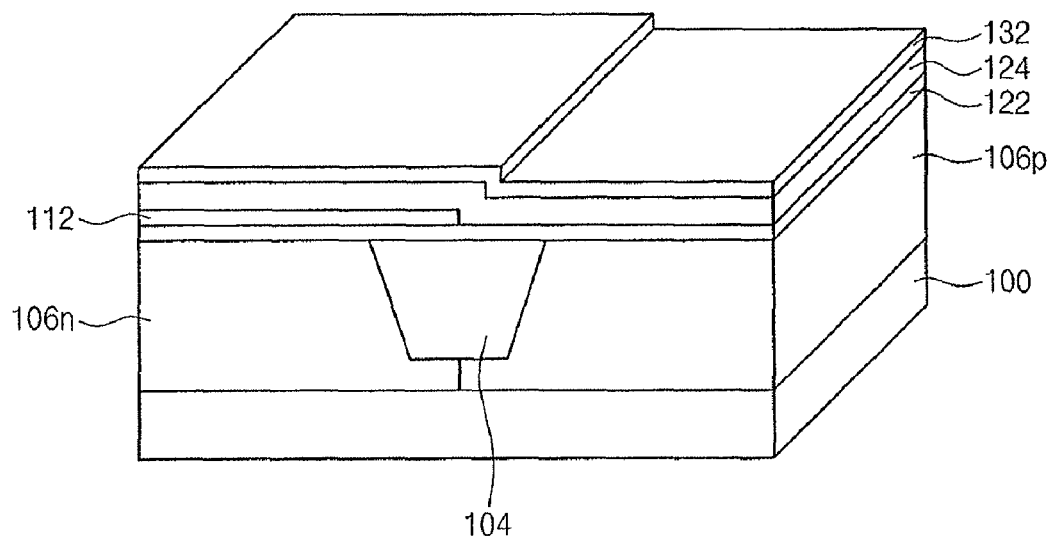

Referring to FIG. 7D, a P-type capping layer 132 may be formed on an entire surface of the semiconductor substrate 100. The P-type capping layer 132 may include, e.g., an aluminum oxide layer and/or an aluminum metal oxide layer. The P-type capping layer 132 may be formed using, e.g., a chemical vapor deposition process, a thermal oxidation process, or an atomic layer deposition process. The P-type capping layer 132 may increase the flat band voltage of the semiconductor device.

Figure 7E:
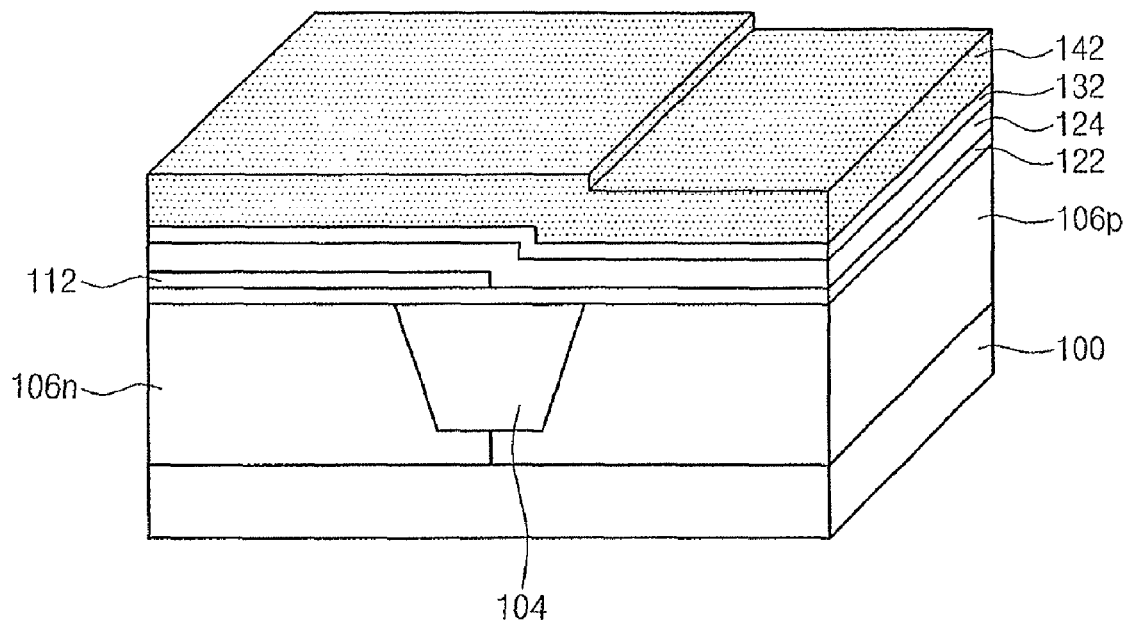

Referring to FIG. 7E, a gate conductive layer 142 may be formed on an entire surface of the semiconductor substrate 100. The gate conductive layer 142 may be formed using, e.g., a chemical vapor deposition process, a thermal oxidation process, or an atomic layer deposition process. The gate conductive layer 142 may include, e.g., TaC, TaN, TaCN, and/or TiN. The gate conductive layer 142 may have a multi-layer structure. The gate conductive layer 142 may include, e.g., a metal layer, a metal silicide layer, a metal oxide layer, a metal nitride layer, and/or a doped polysilicon layer.

Referring to FIGS. 7E and 4, the gate conductive layer 142 and the layers stacked below the gate conductive layer 142 may be patterned to form a first gate structure 200n and a second gate structure 200p.

The first gate structure 200n may include the first lower gate dielectric pattern 122n, the first N-type capping pattern 110n, the first upper gate dielectric pattern 124n, the first P-type capping pattern 130n, and the first gate electrode 140n, which may be sequentially stacked on the first well region 106n. The second gate structure 200p may include the second lower gate dielectric pattern 122p, the second upper gate dielectric pattern 124p, the second P-type capping pattern 130p, and the second gate electrode 140p, which may be sequentially stacked on the second well region 106p.

Spacer dielectrics (not shown) may be disposed on side surfaces of the first gate structure 200n and/or the second gate structure 200p. A source/drain (not shown) may be defined in the active region at each side of the first gate structure 200n. The source/drain may be defined in the active region at each side of the second gate structure 200p. A conductive type of the source/drain may be opposite to the conductive type of the first well region or the second well region.

Figure 8A:
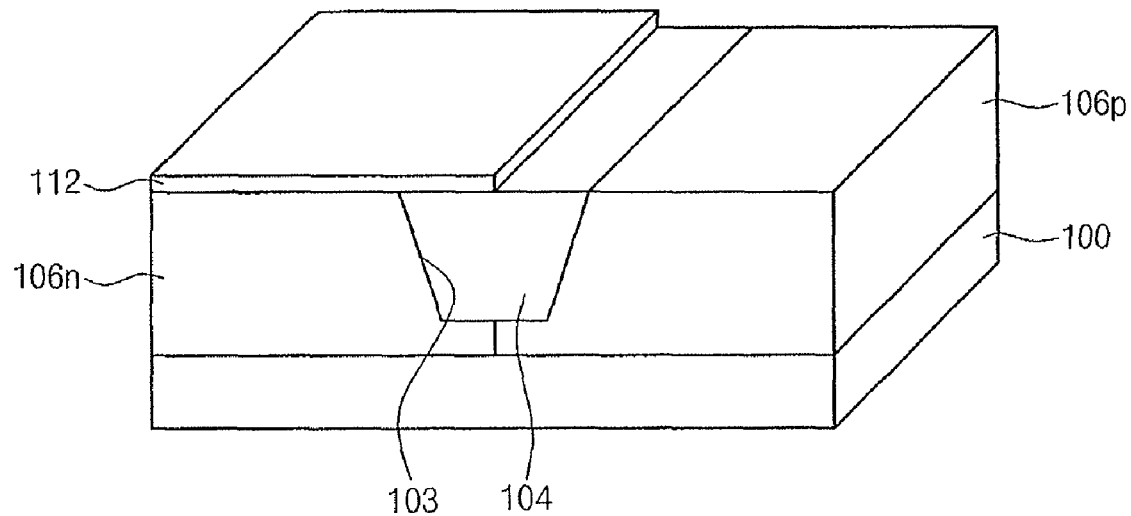
FIGS. 8A to 8F illustrate perspective views of a process of forming a semiconductor device according to another embodiment.

FIGS. 8A to 8F illustrate perspective views of a process of forming a semiconductor device according to another embodiment. Referring to FIG. 8A, a trench 103 may be formed in a semiconductor substrate 100 to define an active region. The trench 103 may be filled with a device isolation layer 104. A height of a top surface of the device isolation layer 104 may be substantially equal to a height of a top surface of the active region. The device isolation layer 104 may be formed using, e.g., a shallow trench isolation process. After the device isolation layer 104 is formed, a first well region 106n and a second well region 106p may be formed in the semiconductor substrate 100 by, e.g., an ion implantation process. The first well region 106n may be a P-well, and the second well region 106p may be an N-well. In an implementation, the first well region 106n and the second well region 106p may be formed before the device isolation layer 104 is formed. An N-type capping layer 112 may be formed on an entire surface of the semiconductor substrate 100. The N-type capping layer 112 may be patterned by etching a portion of the N-type capping layer 112 on the second well region 106p. The etch process may include, e.g., a wet etch process or a dry etch process.

Figure 8B:
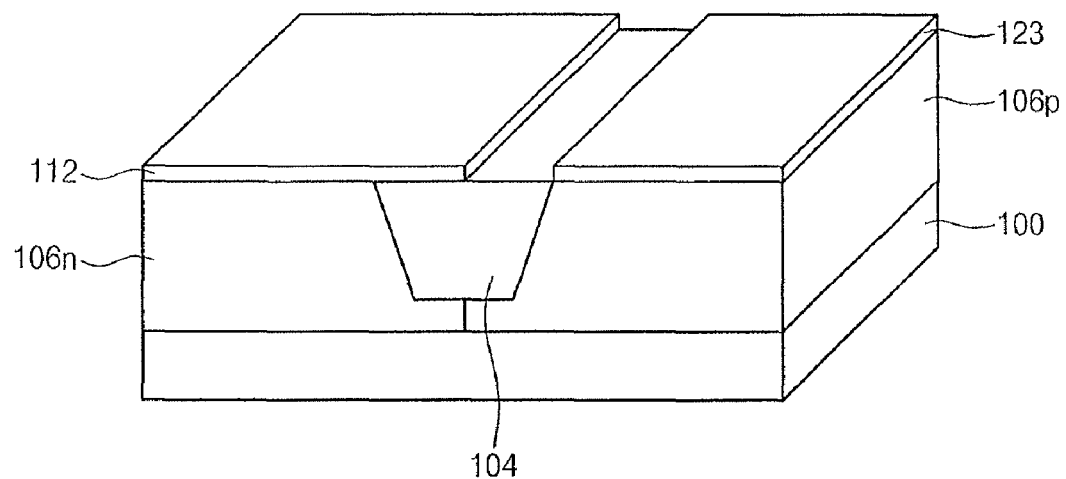

Referring to FIG. 8B, a lower gate dielectric layer 123 may be selectively formed on the second well region 106p. The lower gate dielectric layer 123 may include, e.g., a silicon oxide layer or a silicon oxide nitride layer. The lower gate dielectric layer 123 may be formed using, e.g., a chemical vapor deposition process, a thermal oxidation process, or an atomic layer deposition process.

Figure 8C:
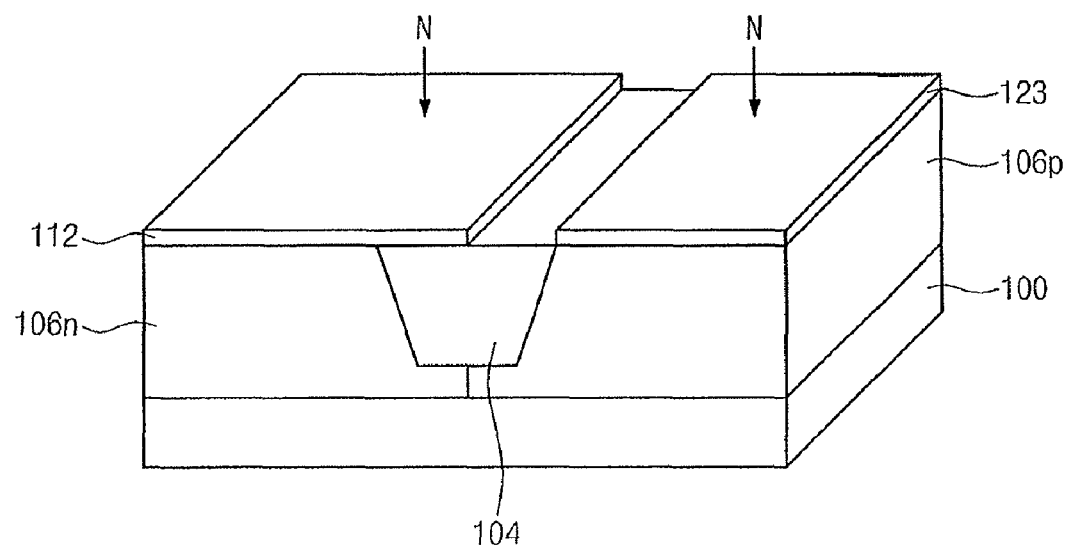

Referring to FIG. 8C, a nitriding process may be performed on an entire surface of the semiconductor substrate including the N-type capping layer 112 and the lower gate dielectric layer 123. Plasma gas including nitrogen may be used in the nitriding process. The nitriding process may performed to, e.g., enhance an interface property between the semiconductor substrate 100 and the N-type capping layer 112 and an interface property between the semiconductor substrate 100 and the lower gate dielectric layer 123. The nitriding process may be performed to, e.g., inhibit an undesirable increase of the effective oxide thickness (EOT).

Figure 8D:
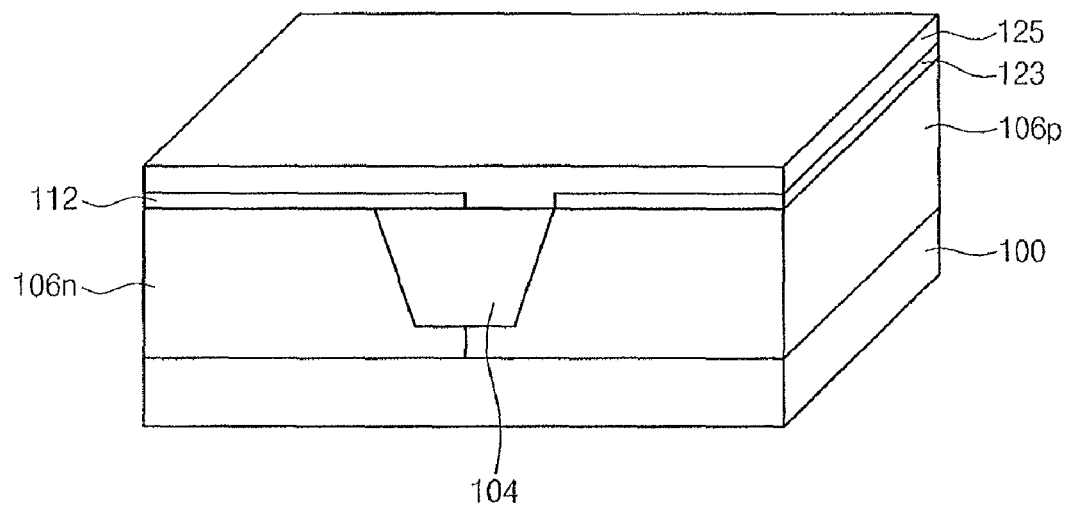

Referring to FIG. 8D, an upper gate dielectric layer 125 may be formed on the N-type capping layer 112 and the lower gate dielectric layer 123. The upper gate dielectric layer 123 may include, e.g., a silicon oxide layer, a silicon oxide nitride layer, a hafnium oxide layer, a hafnium silicon oxide layer, a zirconium oxide layer, a zirconium silicon oxide layer, a hafnium oxide nitride layer, a hafnium silicon oxide nitride layer, a zirconium oxide nitride layer, a zirconium silicon oxide nitride layer, and/or a tantalum oxide layer. The upper gate dielectric layer 125 may be formed using, e.g., a chemical vapor deposition process, a thermal oxidation process, or an atomic layer deposition process.

Figure 8E:
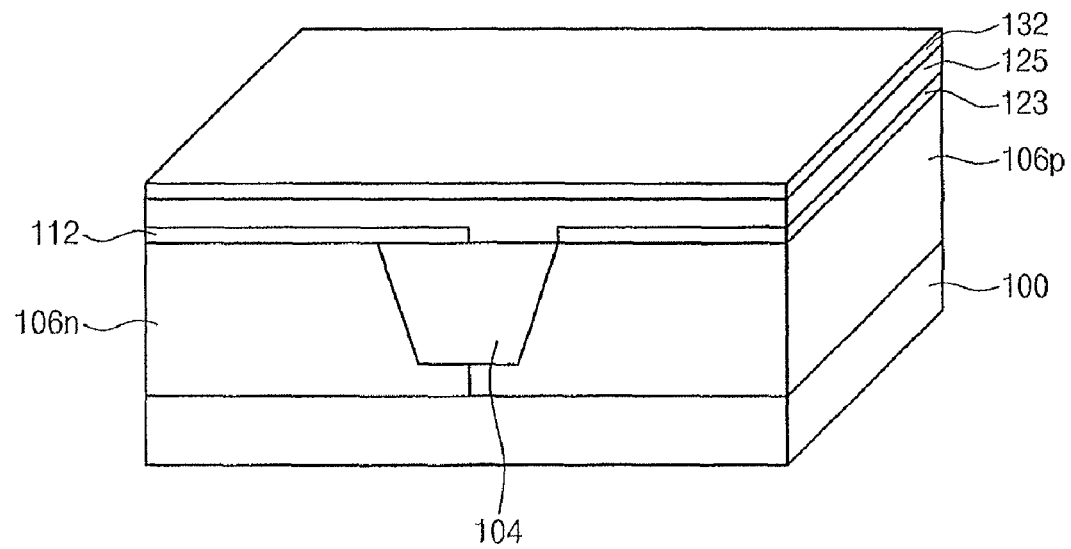

Referring to FIG. 8E, a P-type capping layer 132 may be formed on an entire surface of the semiconductor substrate 100. The P-type capping layer 132 may include, e.g., a silicon oxide layer and/or a silicon oxide nitride layer.

Figure 8F:
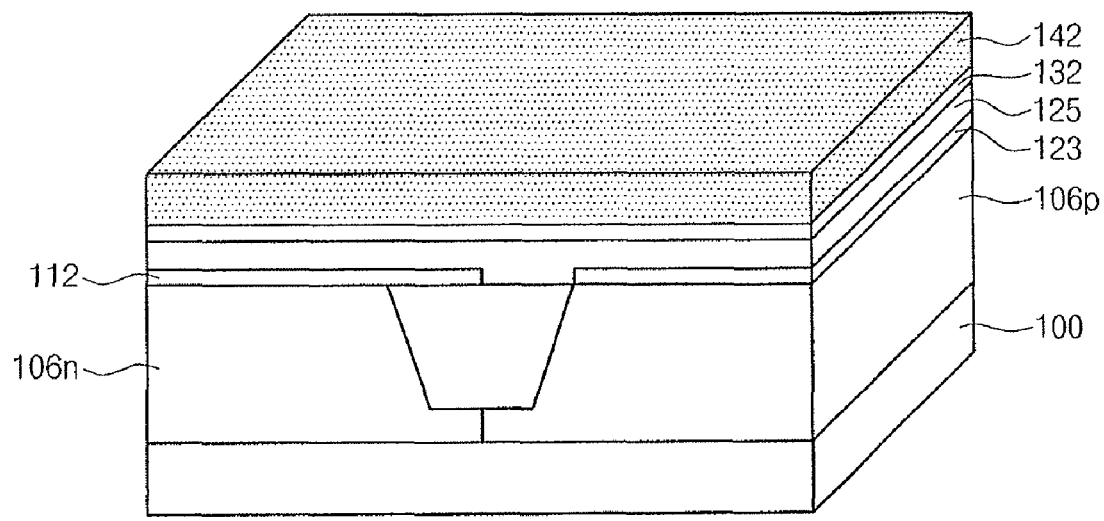

Referring to FIG. 8F, a gate conductive layer 142 may be formed on an entire surface of the semiconductor substrate 100. The gate conductive layer 142 may include, e.g., TaC, TaN, TaCN, and/or TiN. The gate conductive layer 142 may have a multi-layer structure. The gate conductive layer 142 may include, e.g., a metal layer, a metal silicide layer, a metal oxide layer, a metal nitride layer, and/or a doped polysilicon layer.

Referring to FIGS. 8F and 5, the gate conductive layer 142 and the layers stacked below the gate conductive layer 142 may be patterned to form the first gate structure 200n and the second gate structure 200p.

The first gate structure 200n may include the first N-type capping pattern 110n, the first gate dielectric pattern 120n, the first P-type capping pattern 130n, and the first gate electrode 140n, which may be sequentially stacked on the first well region 106n. The second gate structure 200p may include the second lower gate dielectric pattern 122p, the second upper gate dielectric pattern 124p, the second P-type capping pattern 130p, and the second gate electrode 140p, which may be sequentially stacked on the second well region 106p.

Figure 9A:
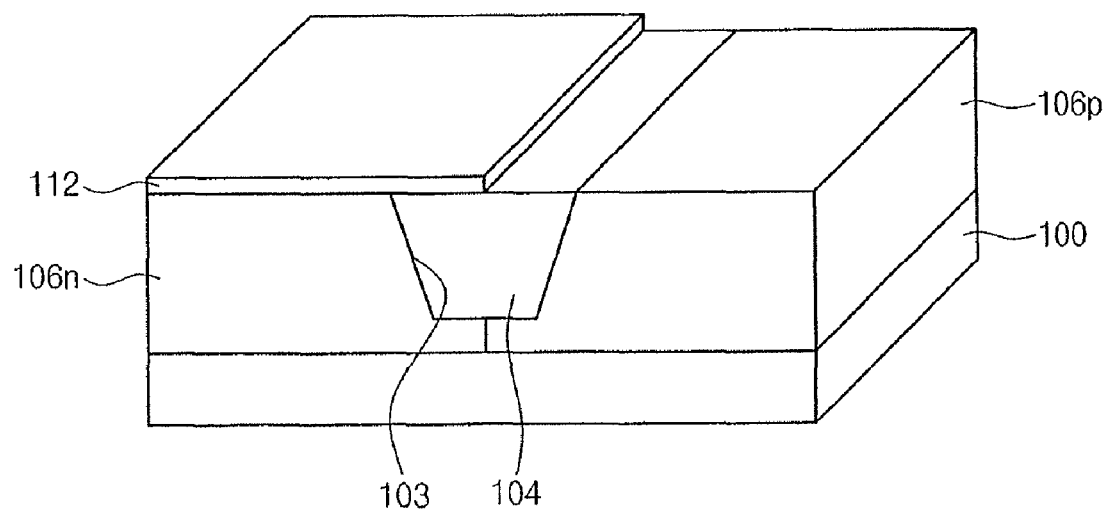
FIGS. 9A to 9D illustrate perspective views of a process of forming a semiconductor device according to yet another embodiment.

FIGS. 9A to 9D illustrate perspective views of a process of forming a semiconductor device according to yet another embodiment. Referring to FIG. 9A, a trench 103 may be formed in a semiconductor substrate 100 to define an active region. The trench 103 may be filled with a device isolation layer 104. A height of a top surface of the device isolation layer 104 may be substantially equal to a height of a top surface of the active region. The device isolation layer 104 may be formed using, e.g., a shallow trench isolation process. After the device isolation layer 104 is formed, an ion implantation process may be performed to form the first well region 106n and the second well region 106p in the semiconductor substrate 100. The first well region 106n may be a P-well, and the second well region 106p may be an N-well.

An N-type capping layer 112 may be formed on an entire surface of the semiconductor substrate 100. The N-type capping layer 112 may include, e.g., LaO, GdO, DyO, SrO, BaO, and/or ErO. The N-type capping layer 112 may decrease a flat band voltage of the semiconductor device. The N-type capping layer 112 may then be patterned to etch a portion of the N-type capping layer 112 on the second well region 106p. The etch process may include, e.g., a wet etch process or a dry etch process.

Figure 9B:
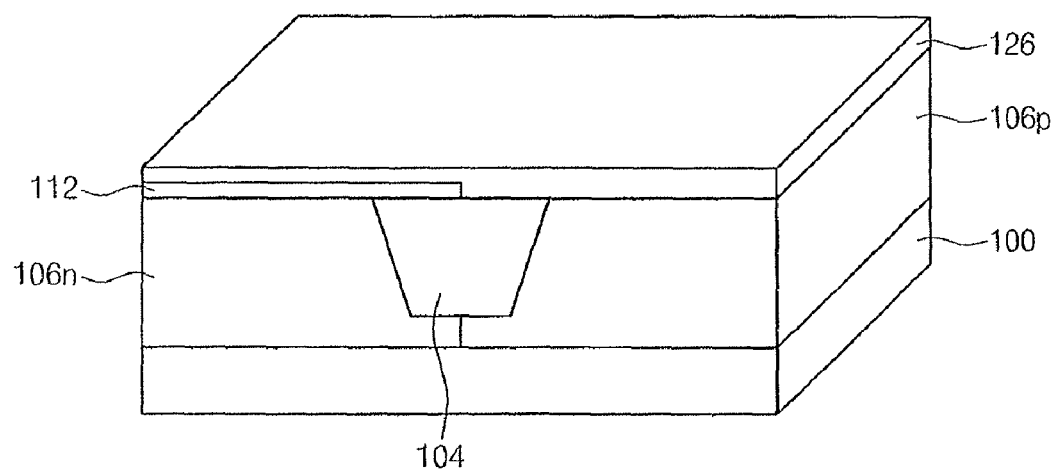

Referring to FIG. 9B, a gate dielectric layer 126 may be formed on an entire surface of the semiconductor substrate 100. The gate dielectric layer 126 may be formed on the N-type capping layer 112 and the second well region 106p. The gate dielectric layer 126 may be formed using, e.g., a chemical vapor deposition process, a thermal oxidation process, or an atomic layer deposition process. The gate dielectric layer 126 may include, e.g., a silicon oxide layer, a silicon oxide nitride layer, a hafnium oxide layer, a hafnium silicon oxide layer, a zirconium oxide layer, a zirconium silicon oxide layer, a hafnium oxide nitride layer, a hafnium silicon oxide nitride layer, a zirconium oxide nitride layer, a zirconium silicon oxide nitride layer, and/or a tantalum oxide layer. The gate dielectric layer 126 on the N-type capping pattern 112 may have a thickness less than a thickness of the gate dielectric 126 on the second well region 106p.

Figure 9C:
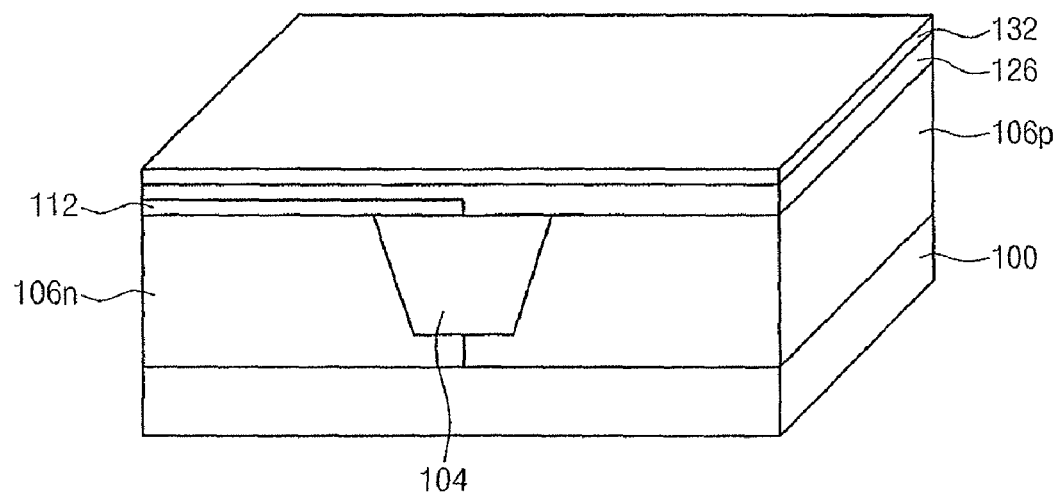

Referring to FIG. 9C, a P-type capping layer 132 may be formed on the gate dielectric layer 126. The P-type capping layer 132 may include, e.g., a silicon oxide layer and/or a silicon oxide nitride layer.

Figure 9D:
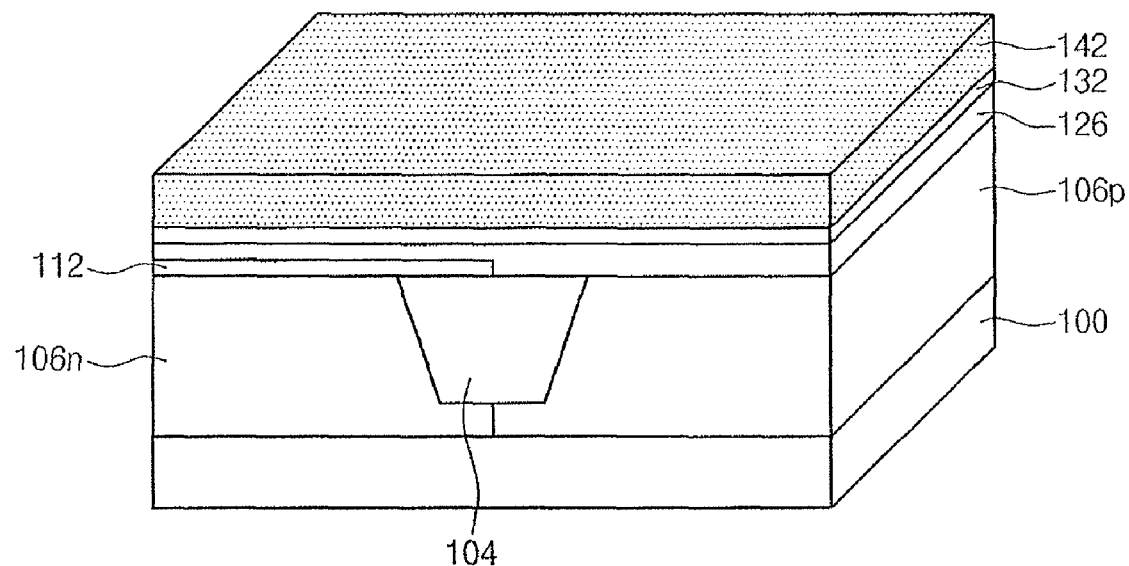

Referring to FIG. 9D, a gate conductive layer 142 may be formed on the P-type capping layer 132. The gate conductive layer 142 may include, e.g., TaC, TaN, TaCN, and/or TiN. The gate conductive layer 142 may have a multi-layer structure. The gate conductive layer 142 may include, e.g., a metal layer, a metal silicide layer, a metal oxide layer, a metal nitride layer, and/or a doped polysilicon layer.

Referring to FIGS. 9D and 6, the gate conductive layer 142 and the layers stacked below the gate conductive layer 142 may be patterned to form the first gate structure 200n and the second gate structure 200p.

The first gate structure 200n may include the first N-type capping pattern 110n, the first gate dielectric pattern 120n, the first P-type capping pattern 130n, and the first gate electrode 140n, which may be sequentially stacked on the first well region 106n. The second gate structure 200p may include the second gate dielectric pattern 120p, the second P-type capping pattern 130p, and the second gate electrode 140p, which may be sequentially stacked on the second well region 106p.

Figure 10:
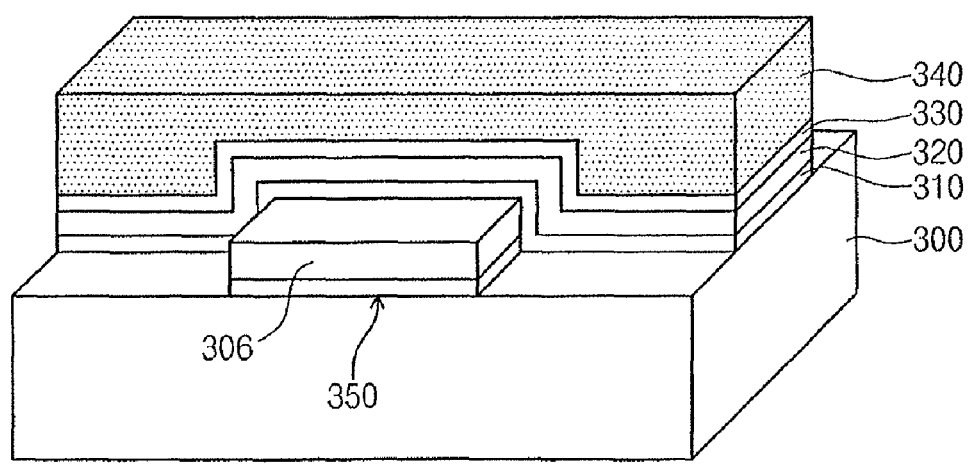
FIG. 10 illustrates a perspective view of a semiconductor device according to an embodiment.

FIG. 10 illustrates a perspective view of a semiconductor device according to an alternative embodiment. Referring to FIG. 10, a semiconductor fin 350 vertically extending from a semiconductor substrate 300 may be disposed on the semiconductor substrate 300. A gate electrode 340 may cross the semiconductor fin 350. The gate electrode 340 may pass over both sidewalls and a top surface of the semiconductor fin 350. A gate dielectric pattern 320, an N-type capping pattern 310, and a P-type capping pattern 330 may be disposed between the gate electrode 340 and the semiconductor fin 350. An upper region of the semiconductor fin 350 may be a first well region 306. The first well region 306 may be doped with N-type or P-type impurities. Semiconductor fins 350 disposed on each side of the gate electrode 340 may serve as a source/drain.

The gate dielectric pattern 320 may include, e.g., a silicon oxide layer, a silicon oxide nitride layer, a hafnium oxide layer, a hafnium silicon oxide layer, a zirconium oxide layer, a zirconium silicon oxide layer, a hafnium oxide nitride layer, a hafnium silicon oxide nitride layer, a zirconium oxide nitride layer, a zirconium silicon oxide nitride layer, and/or a tantalum oxide layer. The N-type capping pattern 310 may include, e.g., LaO, GdO, DyO, SrO, BaO, and/or ErO. The P-type capping pattern 330 may include, e.g., a silicon oxide layer and/or a silicon oxide nitride layer. The gate electrode 340 may include, e.g., TaC, TaN, TaCN, and/or TiN.

Figure 11:
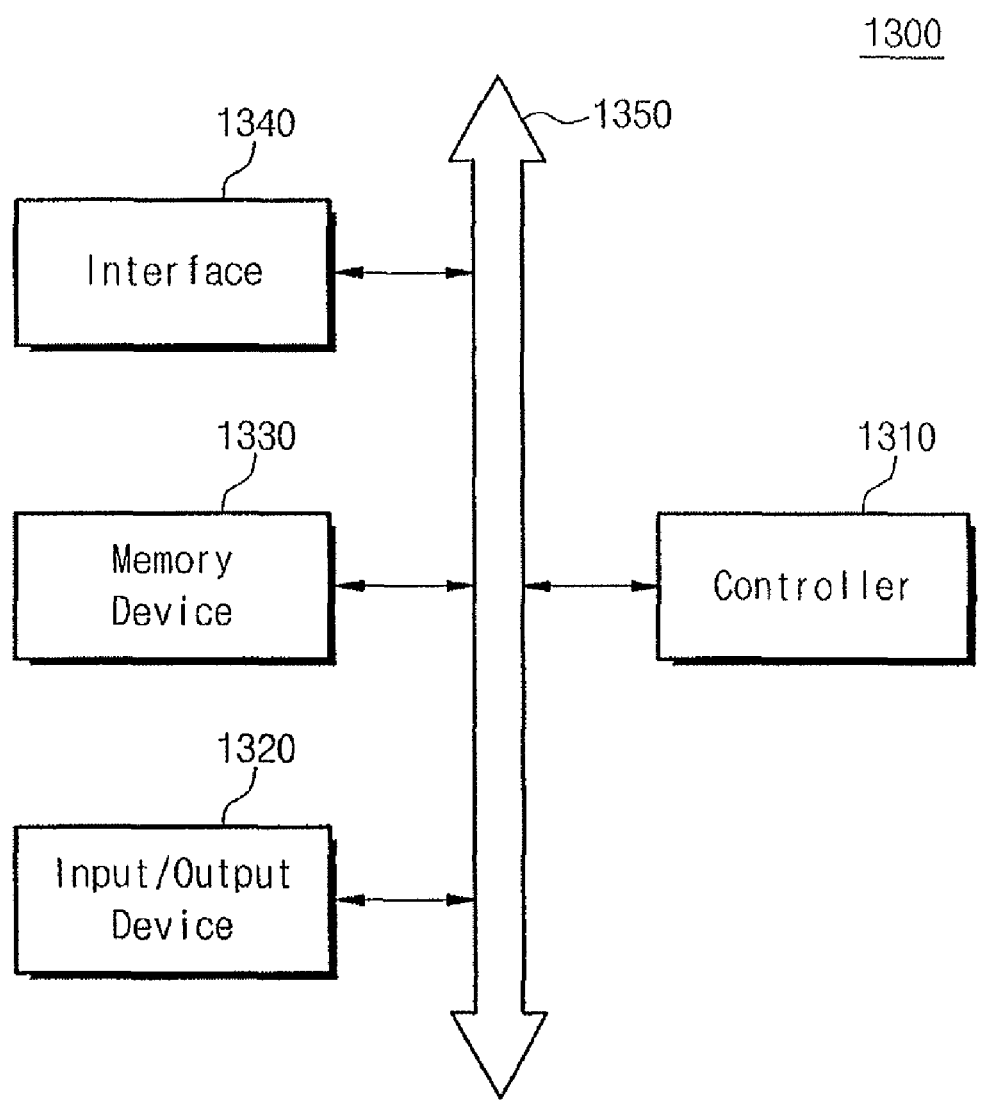
FIG. 11 illustrates a block diagram of an electronic system including a semiconductor device according to an embodiment.

FIG. 11 illustrates a block diagram of an electronic system including a semiconductor device according to an embodiment. Referring to FIG. 11, an electronic system 1300 may include a controller 1310, an input/output device 1320, a memory device 1330, and an interface 1340, all of which may be connected to each other through a bus 1350. The bus 1350 may provide a path through which data may be transferred. The controller 1310 may include, e.g., a microprocessor, a digital signal processor, a microcontroller, and/or logic devices capable performing similar functions thereof. The input/output device 1320 may include, e.g., a keypad, a keyboard, and/or a display device. The memory device 1330 may be a device that stores data. The memory device 1330 may store data and/or commands that may be executed by the controller 1310. The memory device 1330 may include at least one of the semiconductor devices of an embodiment. The electronic system 1300 may further include an interface 1340 to transmit data to a communication network or receive data from the communication network. The interface 1340 may be coupled to the network via a wired or wireless coupling. For example, the interface 1340 may include an antenna or a wired/wireless transceiver.

The electronic system 1300 may be, e.g., a mobile system, a personal computer, an industrial computer, or a system that performs various functions. The mobile system may include, e.g., a personal digital assistant (PDA), a portable computer, a web tablet, a mobile phone, a wireless phone, a laptop computer, a memory card, a digital music system, or an information transmitting/receiving system. If the electronic system 1300 is equipment used for wireless communication, it may include a communication interface protocol for third generation communication systems, e.g., Code Division Multiple Access (CDMA), Global System for Mobile Communications (GSM), North American Digital Cellular (NADC), Extended-Time Division Multiple Access (E-TDMA), Wideband Code Division Multiple Access (WCDMA), and CDMA2000.

Figure 12:
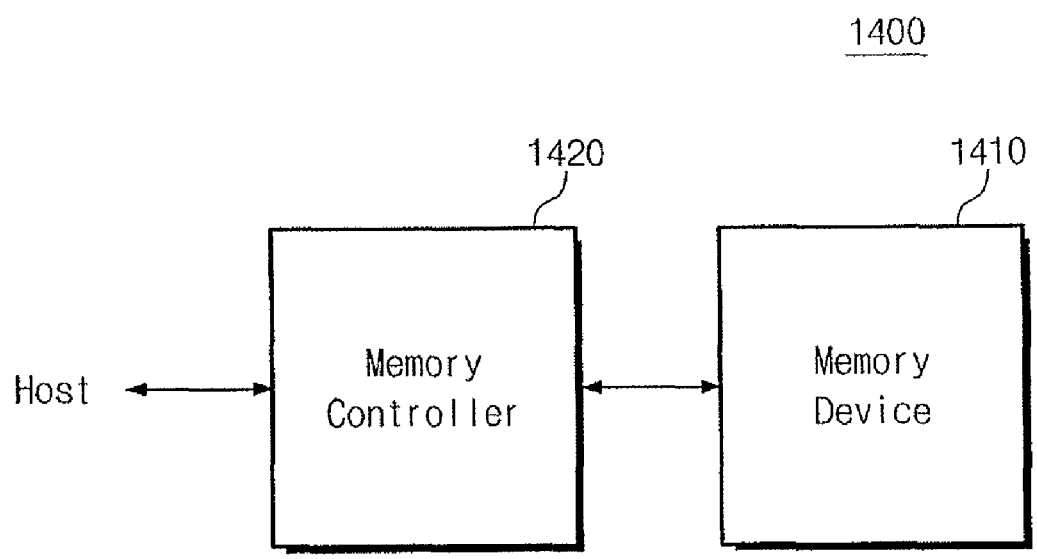
FIG. 12 illustrates a block diagram of a memory card including a semiconductor device according to an embodiment.

Next, a memory card according to an embodiment will be described with reference to FIG. 12. FIG. 12 illustrates a block diagram of a memory card including a semiconductor device according to an embodiment.

Referring to FIG. 12, a memory card 1400 may include a non-volatile memory device 1410 and a memory controller 1420. The non-volatile memory device 1410 or the memory controller 1420 may include the semiconductor device of an embodiment. The non-volatile memory device 1410 may store data or read the stored data. The non-volatile memory device 1410 may include at least one of the non-volatile memory devices of an embodiment. The memory controller 1420 may control the non-volatile memory device 1410 to read stored data or store data therein in response to a read/write request of a host.

The semiconductor device according to an embodiment may adjust the threshold voltage by stacking the first N-type capping pattern and the first P-type capping pattern. In addition, the method of fabricating the semiconductor device may be simplified.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of forming a semiconductor device, comprising:
    forming a trench in a semiconductor substrate;
    forming a device isolation layer in the trench to define at least one active region;
    forming a first well region in the semiconductor substrate;
    forming, on the semiconductor substrate including the device isolation layer, a first N-type capping layer;
    forming a first gate dielectric on the first N-type capping layer;
    forming a first P-type capping layer on the first gate dielectric;
    forming a first gate conductive layer on the first P-type capping layer; and
    patterning the layers to form a first gate electrode, a first P-type capping pattern, a first gate dielectric pattern, and a first N-type capping pattern.

2. A method of forming a semiconductor device, comprising:
    forming a trench in a semiconductor substrate;
    forming a device isolation layer in the trench to define at least one active region;
    forming a first well region and a second well region in the semiconductor substrate; and
    forming a first gate structure on the first well region and a second gate structure on the second well region, such that the first gate structure includes a first N-type capping pattern, a first gate dielectric pattern, a first P-type capping pattern, and a first gate electrode, such that the second gate structure includes a second gate dielectric pattern, a second P-type capping pattern, and a second gate electrode, and such that the first P-type capping pattern includes the same material as the second P-type capping pattern, and the first gate electrode includes the same material as the second gate electrode.

3. The method as claimed in claim 2, wherein forming the first gate structure on the first well region and the second gate structure on the second well region includes:
    forming an N-type capping layer on the first well region;
    forming a gate dielectric layer on the first well region and the second well region;
    forming a P-type capping layer on an entire surface of the gate dielectric layer;
    forming a gate conductive layer on the P-type capping layer; and
    patterning a stack of the layers on the first well region and the second well region to form the first gate structure and the second gate structure.

4. The method as claimed in claim 2, wherein the forming of the first gate structure on the first well region and the second gate structure on the second well region includes:
    forming a lower gate dielectric layer on the first well region and the second well region;
    forming an N-type capping layer on the lower gate dielectric layer of the first well region;
    forming an upper gate dielectric layer on the first well region and the second well region;
    forming a P-type capping layer on an entire surface of the upper gate dielectric layer;
    forming a gate conductive layer on the P-type capping layer; and
    patterning a stack of the layers on the first well region and the second well region to form the first gate structure and the second gate structure.

5. The method as claimed in claim 2, wherein the forming of the first gate structure on the first well region and the second gate structure on the second well region includes:
    forming an N-type capping layer on the first well region;
    forming a lower gate dielectric layer on the second well region;
    nitriding the N-type capping layer and the lower gate dielectric layer;
    forming an upper gate dielectric layer on entire surfaces of the N-type capping layer and the lower gate dielectric layer;
    forming a P-type capping layer on an entire surfaces of the upper gate dielectric;

forming a gate conductive layer on the P-type capping layer; and patterning a stack of the layers on the first well region and the second well region to form the first gate structure and the second gate structure.

6. The method as claimed in claim 2, wherein the forming of the first gate structure on the first well region and the second gate structure on the second well region includes:

forming an N-type capping layer on the first well region;

forming a gate dielectric layer on the N-type capping layer and the second well region;

forming a P-type capping layer on entire surfaces of the N-type capping layer and the gate dielectric layer;

forming a gate conductive layer on the P-type capping layer; and patterning a stack of the layers on the first well region and the second well region to form the first gate structure and the second gate structure.

7. The method as claimed in claim 2, wherein the first N-type capping pattern includes at least one of LaO, GdO, DyO, SrO, BaO, and ErO.

8. The method as claimed in claim 2, wherein the first P-type capping pattern includes at least one of an aluminum oxide layer and an aluminum metal oxide layer.

9. The method as claimed in claim 2, wherein the first gate dielectric pattern and the second gate dielectric pattern each independently include at least one of a silicon oxide layer, a silicon oxide nitride layer, a hafnium oxide layer, a hafnium silicon oxide layer, a zirconium oxide layer, a zirconium silicon oxide layer, a hafnium oxide nitride layer, a hafnium silicon oxide nitride layer, a zirconium oxide nitride layer, a zirconium silicon oxide nitride layer, and a tantalum oxide layer.

* * * * *